United States Patent [19]

Miyamoto

[11] 4,350,957

[45] Sep. 21, 1982

[54] PULSE COUNTER-TYPE FM DETECTOR

[75] Inventor: Yukihiko Miyamoto, Tokyo, Japan

[73] Assignee: Trio Kabushiki Kaisha, Tokyo, Japan

[21] Appl. No.: 140,821

[22] Filed: Apr. 16, 1980

[30] Foreign Application Priority Data

Apr. 20, 1979 [JP] Japan ........................... 54-53969[U]

[51] Int. Cl.[3] ...................... H03D 3/04; H03K 3/284; H04B 1/16

[52] U.S. Cl. .................................. 329/107; 307/273; 307/510; 329/128; 455/214

[58] Field of Search ...................... 329/104, 107, 128; 307/273, 233; 455/214, 337

[56] References Cited

U.S. PATENT DOCUMENTS 3,723,764 3/1973 Sharp ................................ 329/107

4,236,253 11/1980 Onishi et al. ....................... 329/128

*Primary Examiner*—Ernest F. Karlsen

*Attorney, Agent, or Firm*—Gerald J. Ferguson, Jr.; Joseph J. Baker

[57] ABSTRACT

In a pulse counter-type FM detector circuit for obtaining audio signals at an output terminal by detecting FM signals in the following order through a limiter circuit, a trigger pulse generating circuit, a monostable circuit and an integrator connected to the output terminal where the monostable circuit comprises a gate circuit having at least two inputs where trigger pulses from the trigger pulse generating circuit are applied to a first one of the two inputs and a feedback signal to the other input, a differentiating circuit responsive to the output from the gate circuit, a differential inverter having a power supply and where the integrator includes an LC type low pass filter connected to the output side of the differential inverter circuit, the improvement comprising a terminal resistor connected between the power supply and the output terminal so that a part of the current flowing in the differential inverter circuit is diverted through the terminal resistor.

6 Claims, 3 Drawing Figures

PULSE COUNTER-TYPE FM DETECTOR

RELATED APPLICATIONS

This application is related to U.S. Application Ser. No. 859,539, (now U.S. Pat. No. 4,182,963) filed Dec. 12, 1977; Ser. No. 967,636, (now U.S. Pat. No. 4,293,781) filed Dec. 8, 1978; Ser. No. 967,639, (now U.S. Pat. No. 4,254,346) filed Dec. 8, 1978; Ser. No. 967,640, (now U.S. Pat. No. 4,223,237) filed Dec. 8, 1978; and Ser. No. 74,680, (now U.S. Pat. No. 4,236,253) filed Sept. 12, 1979. All of the foregoing applications are hereby incorporated herein by reference.

BACKGROUND OF THE INVENTION

This invention relates to an improved pulse counter-type FM detector circuit.

FIG. 1 is a block diagram of a conventional pulse counter-type FM detector circuit. The FM signals applied to input terminal 1 are shaped into pulse signals by a limiter circuit 2, changed to trigger pulses by a trigger pulse generating circuit 3, and are converted into pulse signals having a fixed width by a monostable circuit 7 which is comprised of a gate circuit 4, a differentiating circuit 5, and an inverter circuit 6. The audio signals detected at the output terminal 9 are obtained through the integrator 8.

As previously described in Japanese Utility Model Application No. Sho-52(1977)-141079 and as illustrated in FIG. 2 of the present application, a circuit superior to the pulse counter-type FM detector circuit of FIG. 1 can result in reduced output of high frequency radiation and increased demodulated output by using a differential amplifier circuit that functions as a current switch for inverter circuit 6 of monostable circuit 7. Also, the inverted output applied to integrator 8 may be obtained from the side of the differential inverter circuit that is not used for feedback, this having been described in Japanese Patent Application No. Sho-51(1976)-69606 and also illustrated in FIG. 2.

When the frequency of the FM signals to be detected is relatively low and sufficiently removed from the upper limit frequency of the demodulated output signals, a low pass filter using coils and capacitors—for example, a Tchebychef type filter or the like, is used as integrator 8, this also being shown in FIG. 2. As will be described in more detail hereinafter, the low pass filter has to be of a type that significantly reduces the amplitude of the output pulse signal at the output terminal of the above-mentioned differential inverter circuit in order to reduce negative feedback in the high frequency range of the differential inverter circuit and thus stabilize the pulse width of the output pulse signal. This problem is also discussed in Japanese Patent Application No. Sho-53(1978)-114281 and aforementioned U.S. application Ser. No. 74,680. When the amplitude of the output pulse signal of the inverter circuit is too large, a lower dynamic range results due to transistor saturation in the inverter circuit.

FIG. 2 illustrates in more detail typical portions of the pulse counter-type FM detector circuit of FIG. 1 presently under consideration. The trigger pulses from the trigger pulse generating circuit 3 (not shown in FIG. 2) are applied to input terminal 1'. NAND gate circuit 4 is connected to differential inverter circuit 6 through the differentiating circuit 5. In differential inverter circuit 6, the emitters of transistors $Q_1$ and $Q_2$ are connected in common and then connected to a negative power supply ($-B$) through a constant current source $I_s$. The collector of transistor $Q_1$ is connected to a positive power supply ($+B_1$) through a resistor $R_2$ and the collector of transistor $Q_2$ is connected to a positive power supply ($+B_2$) through a resistor $R_3$. The collector of transistor $Q_1$ is also connected to one input terminal of gate circuit 4 while the collector of transistor $Q_2$ is connected to capacitor $C_5$ and resistor $R_4$ through a Tchebychef type low pass filter 10 (simply noted as LPF hereafter) which is comprised of coils $L_1$ and $L_2$, and capacitors $C_2$, $C_3$, and $C_4$. The base of transistor $Q_1$ is connected to the connection point of the DC power supplies $E_1$ and $E_2$ through the parallel circuit of resistor $R_1$ and diode D while the base of transistor $Q_2$ is connected to the negative power supply ($-B$) through the power supplies $E_1$ and $E_2$.

The operation of the conventional pulse counter-type FM detector circuit of FIG. 2 will now be described. When the FM signal which has been converted to a negative trigger pulse is applied to the input terminal 1', a positive pulse signal is outputted from NAND gate circuit 4, this positive pulse signal being converted to a differential pulse by differentiating circuit 5. Transistor $Q_2$ is normally in an ON-state while transistor $Q_1$ is normally in an OFF-state. Assume a positive differential pulse is applied to the base of transistor $Q_1$. During the rise time of this pulse, transistor $Q_1$ is placed in the ON-state and transistor $Q_2$ in the OFF-state. The base potential of transistor $Q_1$ will then drop in accordance with the time constant $C_1R_1$ of the differentiating circuit 5 so that transistor $Q_1$ will change back to the OFF-state and transistor $Q_2$ to the ON-state at or below the threshold level thereof. A positive signal with a time width of $C_1R_1$ seconds is thus obtained from the output of transistor $Q_2$, and a detected audio signal is obtained at output terminal 9 through integrator 8.

The input capacity of LPF 10 must be rather large in order to reduce the negative feedback sufficiently in the treble range of the differential inverter circuit. Therefore, the insertion loss of the LPF is normally around 6 dB, which is relatively large.

The detector output level at output terminal 9 is proportional to the constant current source $I_s$ and to load resistor $R_3$ where the output current of the constant current source and the resistance of the load resistor are determined by the dynamic range of the differential amplifier used. In the conventional pulse counter-type FM detector circuit of FIG. 2, the terminal resistor $R_4$ of the LPF is connected to the output terminal of LPF 10 via capacitor $C_5$ and not DC-coupled to the output terminal of the differential inverter circuit 6 through coils $L_1$ and $L_2$ of LPF 10. Consequently, the current capacity of the constant current source $I_s$ cannot be increased and the insertion loss of LPF 10 cannot be compensated. Since this insertion loss of LPF 10 reduces the output signal level of the amplifier (not shown) in the following stage connected to terminal 9, it interferes with improvement of the S/N.

SUMMARY OF THE INVENTION

A primary object of this invention is to provide an improved pulse counter-type FM detector circuit without the above-mentioned shortcomings of the conventional circuit.

Other objects and advantages of this invention will be apparent from a reading of the following specification and claims taken with the drawing.

DETAILED DESCRIPTION OF PREFERRED EMBODIMENTS OF THE INVENTION

Figure 1:
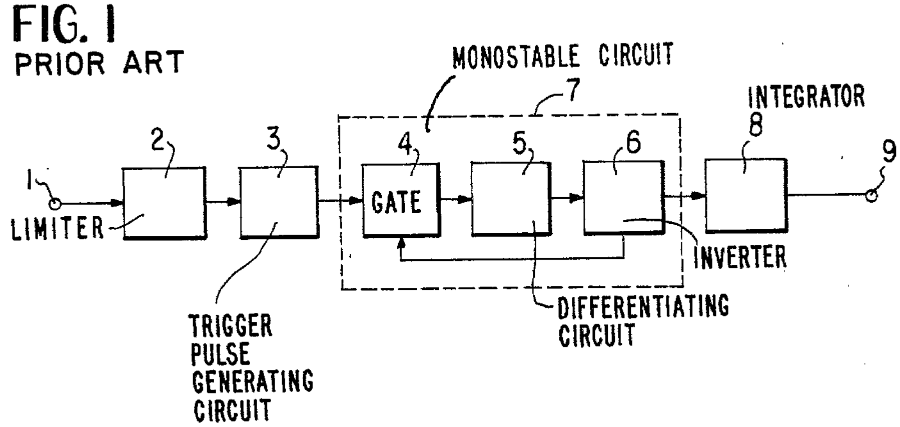
FIG. 1 is a block diagram of a conventional pulse counter-type FM detector circuit.
Figure 2:
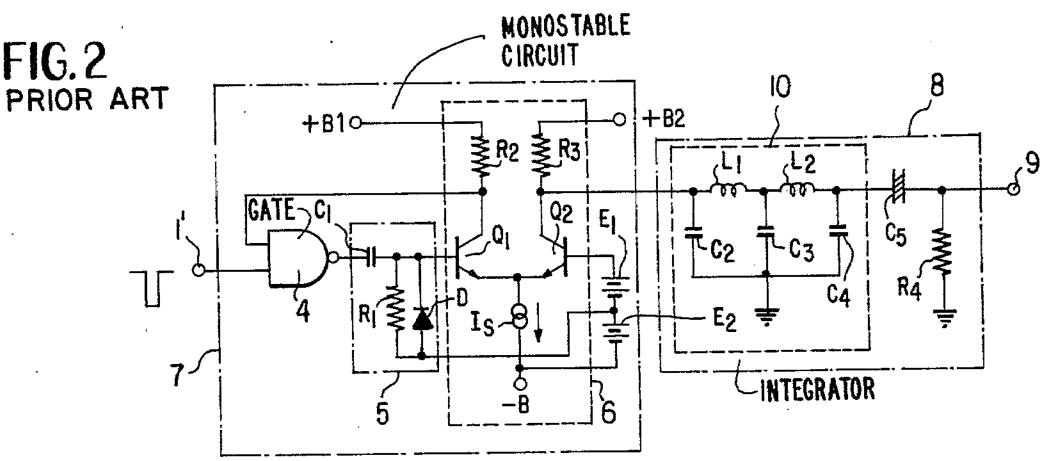
FIG. 2 is a circuit diagram of particular portions of the circuitry of FIG. 1.
Figure 3:
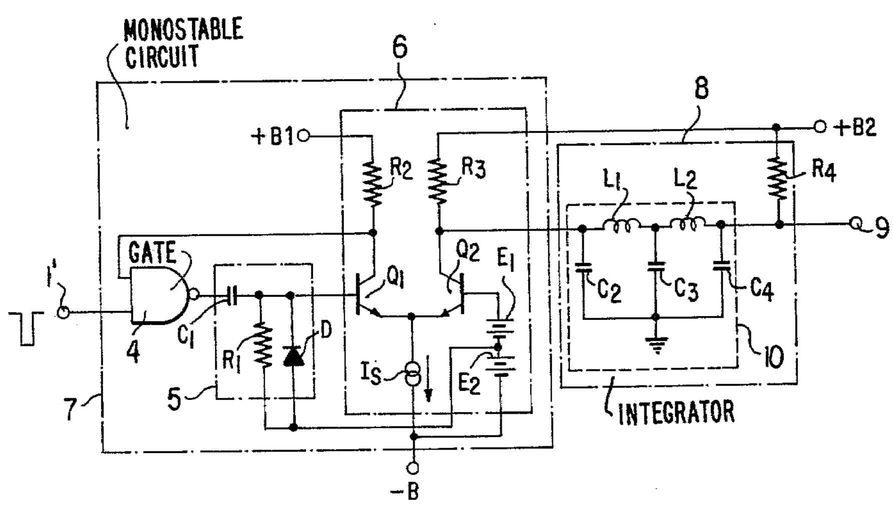
FIG. 3 is a circuit diagram of an illustrative embodiment of particular portions of the pulse counter-type FM detector circuit of the present invention.

FIG. 3 illustrates one practical embodiment of a pulse counter-type FM detector circuit in accordance with the present invention. What is different from the conventional circuit of FIG. 2 is the fact that terminal resistor $R_4$ of LPF 10 is inserted between the positive power supply ($+B_2$) to which the output side load resistor $R_3$ of differential inverter 6 is connected and the output terminal of LPF 10 so that the current of constant current source $I_s$ will also flow into the terminal resistor $R_4$. In FIGS. 1 through 3, like reference numerals refer to like parts or means with equivalent functions.

The detector output level may now be set by considering the dynamic range of the differential amplifier circuit. In other words, the working point used for the FM detector is set near the center of the DC output variability range. The working point in this case means the average potential drop of the output side load resistor $R_3$ when an FM signal of fixed frequency is impressed on the pulse counter type FM detector circuit. Thus, when current is made to flow from the positive power supply ($+B_2$) to terminal resistor $R_4$, the current diverted to terminal resistor $R_4$ flows to the output side transistor $Q_2$, the constant current source $I_s$, and the negative power supply ($-B$) through coils $L_1$ and $L_2$ in order to maintain the working point of the FM detector the same. Consequently, the current flowing to the constant current source $I_s$ increases by the amount of current diverted to terminal resistor $R_4$ and the FM detector output level also increases. Thus, the insertion loss of LPF 10 can be compensated, and the demodulation level to the amplifier circuitry, etc. in the following stages increases, resulting in an improved S/N.

When this invention is used as above, the current capacity of the constant current source of the differential inverter circuit used in the FM detector output stage can be increased, and a sufficiently high demodulation level can be obtained to correspond to the amplifier circuitry, etc. in the following stages.

It is to be understood that the above detailed description of the embodiments of the invention is provided by way of example only. Various details of design and construction may be modified without departing from the true spirit and scope of the invention as set forth in the appended claims.

What is claimed is:

1. In a pulse counter-type FM detector circuit for obtaining audio signals at an output terminal by detecting FM signals in the following order through a limiter circuit, a trigger pulse generating circuit, a monostable circuit and an integrator connected to the output terminal where the monostable circuit comprises a gate circuit having at least two inputs where trigger pulses from said trigger pulse generating circuit are applied to a first one of the two inputs and a feedback signal to the other input, a differentiating circuit responsive to the output from the gate circuit, a differential inverter having a power supply and where said integrator includes an LC type low pass filter connected to the output side of said differential inverter circuit, the improvement comprising a terminal resistor connected between the power supply and the output terminal so that a part of the current flowing in the said differential inverter circuit is diverted through said terminal resistor.

2. The improvement as in claim 1 where a DC path is established between the differential inverter circuit and the output terminal through at least one inductor of the LC low pass filter.

3. The improvement as in claims 1 or 2 including an FM receiver having at least one intermediate frequency amplifier, said limiter being responsive to the intermediate frequency amplifier output for forming square waves, said trigger pulse generating circuit being responsive to the square waves for forming trigger pulses synchronized with the rise or fall of the square waves, said trigger pulses being applied to said first input of the gate circuit, the output of the LC low pass filter being the demodulated output of the FM receiver.

4. In a pulse counter-type FM detector circuit for obtaining audio signals at an output terminal by detecting FM signals in the following order through a limiter circuit, a trigger pulse generating circuit, a monostable circuit and an integrator connected to the output terminal where the monostable circuit comprises a gate circuit having at least two inputs where trigger pulses from said trigger pulse generating circuit are applied to a first one of the two inputs, a differentiating circuit responsive to the output from said gate circuit, a differential inverter circuit including a power supply for a pair of transistors whose emitters are connected in common to a constant current source, the base of the first transistor of said transistor pair being responsive to the output from the differentiating circuit, a load connected to the collector of said first transistor for deriving a feedback signal applied to the other input of said gate circuit and an output load connected to the collector of said second transistor and where said integrator includes an LC type low pass filter connected to the output load of said differential inverter circuit, the improvement comprising a terminal resistor connected between the power supply and the output terminal so that a part of the current flowing through said output load and the second transistor is diverted through said terminal resistor.

5. The improvement as in claim 1 where a DC path is established between the collector of the second transistor and the output terminal through at least one inductor of the LC low pass filter.

6. The improvement as in claims 4 or 5 including an FM receiver having at least one intermediate frequency amplifier, said limiter being responsive to the intermediate frequency amplifier output for forming square waves, said trigger pulse generating circuit being responsive to the square waves for forming trigger pulses synchronized with the rise or fall of the square waves, said trigger pulses being applied to said first input of the gate circuit, the output of the LC low pass filter being the demodulated output of the FM receiver.

* * * * *